US 9,759,784 B2

(12) United States Patent
Lachaize et al.

(10) Patent No.: US 9,759,784 B2
(45) Date of Patent: Sep. 12, 2017

(54) METHOD FOR ESTABLISHING A FUNCTIONAL DIAGNOSIS FOR A BUCK STATIC DC-DC VOLTAGE CONVERTER

(71) Applicants: CONTINENTAL AUTOMOTIVE FRANCE, Toulouse (FR); CONTINENTAL AUTOMOTIVE GmbH, Hannover (DE)

(72) Inventors: Jerome Lachaize, Toulouse (FR); Damien Verdier, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 88 days.

(21) Appl. No.: 14/974,336

(22) Filed: Dec. 18, 2015

(65) Prior Publication Data

US 2016/0178708 A1    Jun. 23, 2016

(30) Foreign Application Priority Data

Dec. 22, 2014   (FR) ..................................... 14 63049

(51) Int. Cl.
G01R 31/40 (2014.01)
B60L 11/18 (2006.01)
H02M 3/04 (2006.01)

(52) U.S. Cl.
CPC .............. G01R 31/40 (2013.01); B60L 11/18 (2013.01); H02M 3/04 (2013.01)

(58) Field of Classification Search
CPC .. G01R 31/3658; G01R 11/465; G01R 22/00; G01R 13/38; G01R 23/005;

(Continued)

(56) References Cited

U.S. PATENT DOCUMENTS

2005/0254273 A1    11/2005   Soudier et al.
2011/0316524 A1 *  12/2011   Kim ....................... G01R 31/40
                                                                    324/120

(Continued)

OTHER PUBLICATIONS

Digeronimo, John, STIC search for U.S. Appl. No. 14/974,336 (May 4, 2017).*

(Continued)

Primary Examiner — Tung X Nguyen
Assistant Examiner — Robert P Alejnikov, Jr.
(74) Attorney, Agent, or Firm — Young & Thompson

(57) ABSTRACT

A method for establishing a functional diagnosis for a buck static DC-DC voltage converter in an electric or hybrid vehicle including a power supply circuit including at least a first and a second electrical voltage source supplying respectively a primary and a secondary circuit with direct current, the first source having a voltage value greater than the second source, the primary and secondary circuits being connected by the voltage converter which itself is commanded by control and safety elements, includes the following sequential steps:
  deactivating any power consumer on the primary circuit or waiting for any power consumer on the primary circuit to be inactive,
  commanding from the converter an output voltage greater than the voltage of the second electrical voltage source,
  determining if there is a power transfer from the primary to the secondary circuit, and:
  if not, establishing a faulty functionality diagnosis for the converter.

15 Claims, 5 Drawing Sheets

(58) Field of Classification Search
CPC ............ G01R 1/06711; G01R 1/07314; G01R 1/07342; G01R 1/07364; G01R 3/00; G01R 31/2886; G01R 15/18; G01N 31/02; H01Q 1/2233; H02J 7/022; H01F 27/40; H01F 2027/408; H01F 27/425; G05F 1/13; G05F 1/14; G05F 1/16; G05F 1/24; G05F 1/32
USPC .................... 324/426–437, 764.01; 320/140; 323/355, 359
See application file for complete search history.

(56) References Cited

U.S. PATENT DOCUMENTS

| | | | |
|---|---|---|---|
| 2012/0268058 A1* | 10/2012 | Enoki | B60R 16/033 320/104 |
| 2013/0169310 A1 | 7/2013 | Woo et al. | |
| 2013/0175858 A1* | 7/2013 | Sakurai | B60L 11/1812 307/9.1 |
| 2014/0327467 A1 | 11/2014 | Diewald et al. | |

OTHER PUBLICATIONS

FR Search Report, dated Oct. 15, 2015, from corresponding FR application.

* cited by examiner

METHOD FOR ESTABLISHING A FUNCTIONAL DIAGNOSIS FOR A BUCK STATIC DC-DC VOLTAGE CONVERTER

FIELD OF THE INVENTION

The present invention relates to a method for establishing a functional diagnosis for a buck static DC-DC voltage converter in an electric or hybrid vehicle comprising a power supply circuit, the latter including at least a first electrical voltage source supplying a primary circuit with direct current, and a second electrical voltage source supplying a secondary circuit with direct current, the first source having a voltage value greater than the second source, said primary and secondary circuits being connected to one another by means of said buck static DC-DC voltage converter which itself is commanded by control and safety means. The hybrid vehicles concerned can be micro-hybrid, mild hybrid, or full hybrid vehicles.

The 12 volt on-board network which supplies the computers in a vehicle is a critical element which guarantees the operational safety of the vehicle.

SUMMARY OF THE INVENTION

The present invention proposes a method for identifying the loss of a safety barrier on the on-board network.

More precisely, the invention consists of a method such as defined in the context of use above, which is characterized in that it comprises the following steps:

Deactivating any power consumer on said primary circuit or waiting for any power consumer on the primary circuit to be inactive, Then commanding from said converter an output voltage greater than the voltage of the second electrical voltage source, Then determining if there is a power transfer from said primary circuit to said secondary circuit, and if not, establishing a faulty functionality diagnosis for said converter.

The method according to the invention involves testing the converter for connection between the primary circuit and the secondary circuit supplying the on-board network, such as to check the presence of the safety barrier formed thereby for this secondary network.

According to one advantageous feature, the step of determining if there is a power transfer from said primary circuit to said secondary circuit, involves determining if the discharge current of the first voltage source increases and if the voltage of the second voltage source increases. Discharge current of the first voltage source means, for the present specification, a current which brings about a decrease in the power state of the first voltage source.

According to one advantageous feature, the step of determining if there is a power transfer from said primary circuit to said secondary circuit, involves determining if the discharge current of the first voltage source increases and if the discharge current of the second voltage source decreases. Discharge current of the second voltage source means, for the present specification, a current which brings about a decrease in the power state of the second voltage source.

According to one advantageous feature, the method according to the invention further comprises a step of establishing a correct functionality diagnosis for said converter in the case of a noted power transfer from the primary circuit to the secondary circuit.

According to one advantageous feature, which is an alternative to the previous feature, the method according to the invention further comprises the following steps, in the case of a noted power transfer from the primary circuit to the secondary circuit, and in the case of a current-non-reversible buck static DC-DC voltage converter:

Then commanding from said converter an output voltage that is less than the voltage of the second electrical voltage source, Then determining if the second electrical voltage source discharges into the secondary circuit, and:
  if so, establishing a correct functionality diagnosis for said converter,
  if not, establishing a faulty functionality diagnosis for said converter.

According to one advantageous feature, the step of determining if the second electrical voltage source discharges into the secondary circuit, involves determining if the discharge current of the first voltage source decreases and if the voltage of the second voltage source decreases.

According to one advantageous feature, the step of determining if the second electrical voltage source discharges into the secondary circuit, involves determining if the discharge current of the first voltage source decreases and if the discharge current of the second voltage source increases.

BRIEF DESCRIPTION OF THE DRAWINGS

Other features and advantages will emerge upon reading the following examples of embodiments of the invention, together with the appended drawings, which examples are given by way of nonlimiting illustration.

DETAILED DESCRIPTION OF THE INVENTION

Figure 1:
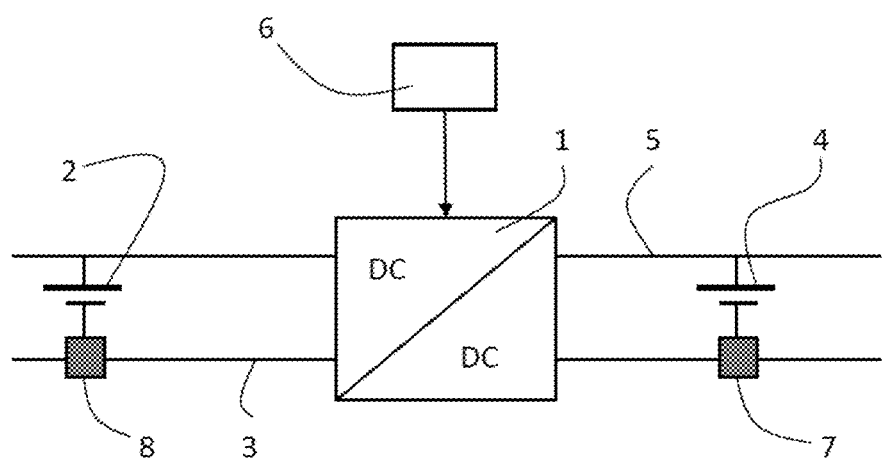
FIG. 1 shows a schematic electric circuit example for implementing a method according to the invention for establishing a functional diagnosis for a buck static DC-DC voltage converter.

The electric circuit schematically shown in FIG. 1 is a power supply circuit of a secondary network with which an electric or hybrid vehicle is provided in a known manner.

This power supply circuit comprises a first electrical voltage source 2 supplying a primary circuit 3 with direct current, and a second electrical voltage source 4 supplying a secondary circuit 5 with direct current, and a buck static DC-DC voltage converter 1 which connects the primary and secondary circuits 3 and 5 to one another, as is shown.

The first voltage source 2 has a voltage value greater than the second voltage source 4. By way of example, the first voltage source 2 can be a battery with a voltage greater than 12 volts, for example a 48-volt battery in the case of a mild hybrid vehicle, and the second voltage source 4 can be a battery with a nominal voltage substantially equal to 12 volts, for example a lead-acid battery.

The primary circuit is, for example, a supply circuit for an electric power train in a full hybrid vehicle, and the secondary circuit comprises the 12-volt on-board network of the vehicle.

The circuit shown in FIG. 1 advantageously comprises a current sensor 7 for measuring the discharge current of the second electrical voltage source 4, and a current sensor 8 for measuring the discharge current of the first electrical voltage source 4. Discharge current means, in the examples described, a current which brings about a decrease in the power state of the corresponding battery.

Figure 2:
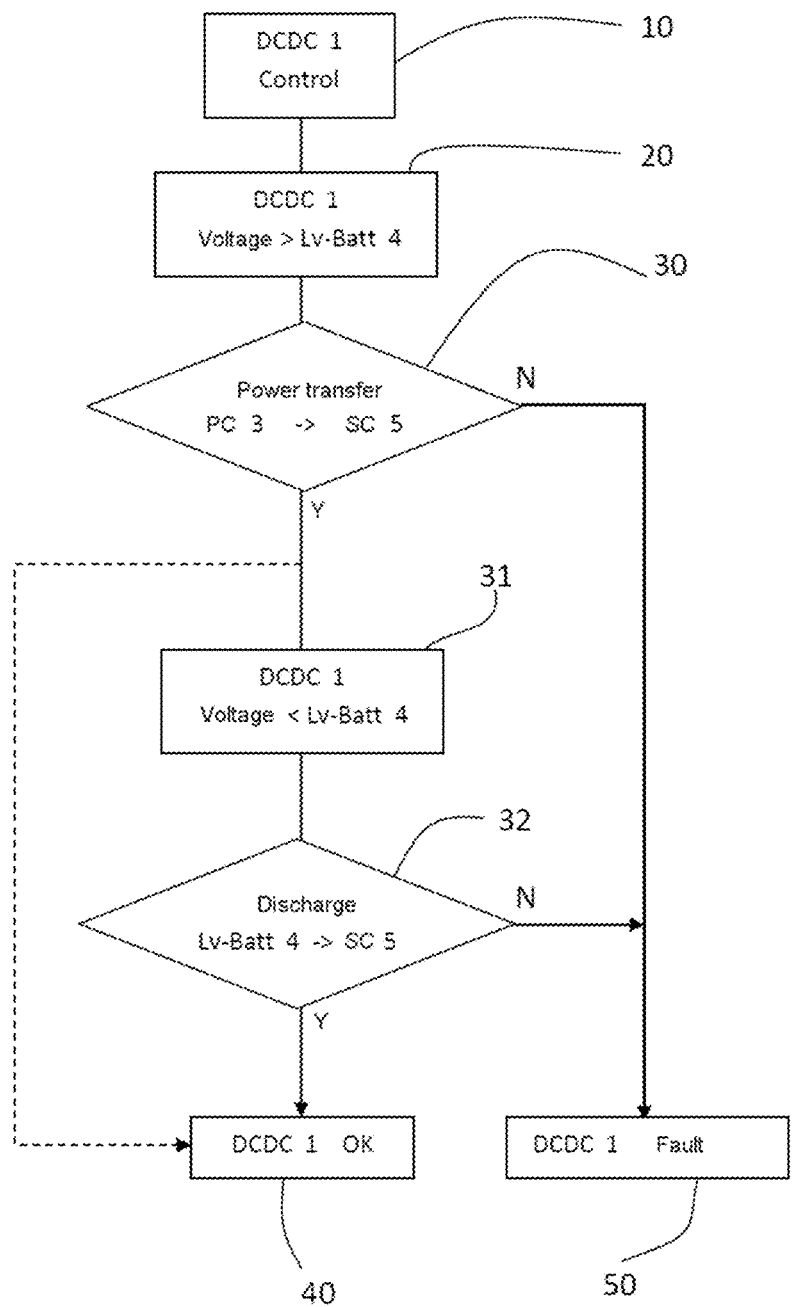
FIG. 2 shows a logical diagram of first and second general examples of a method according to the invention for establishing a functional diagnosis for a buck static DC-DC voltage converter.
Figure 3:
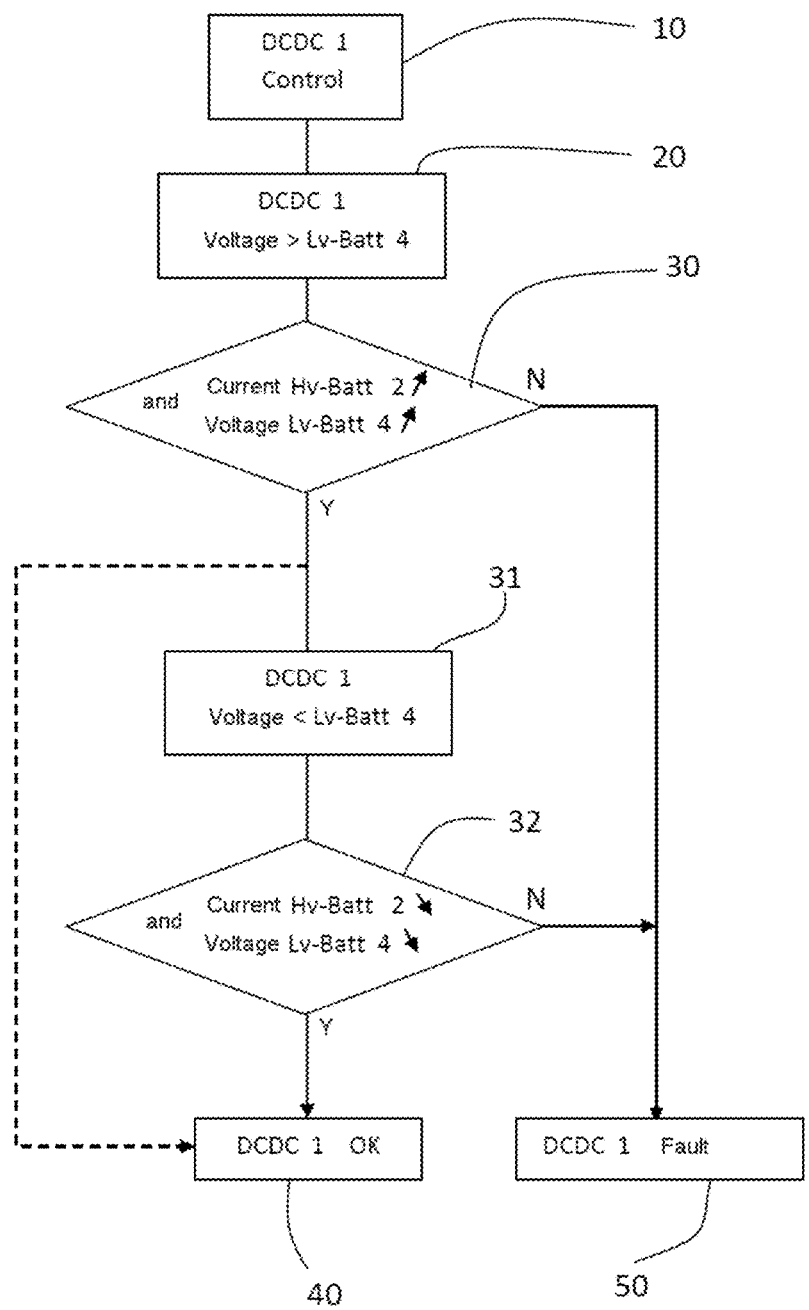
FIG. 3 shows a logical diagram of a first specific example for implementing the first and second general examples according to FIG. 1.
Figure 4:
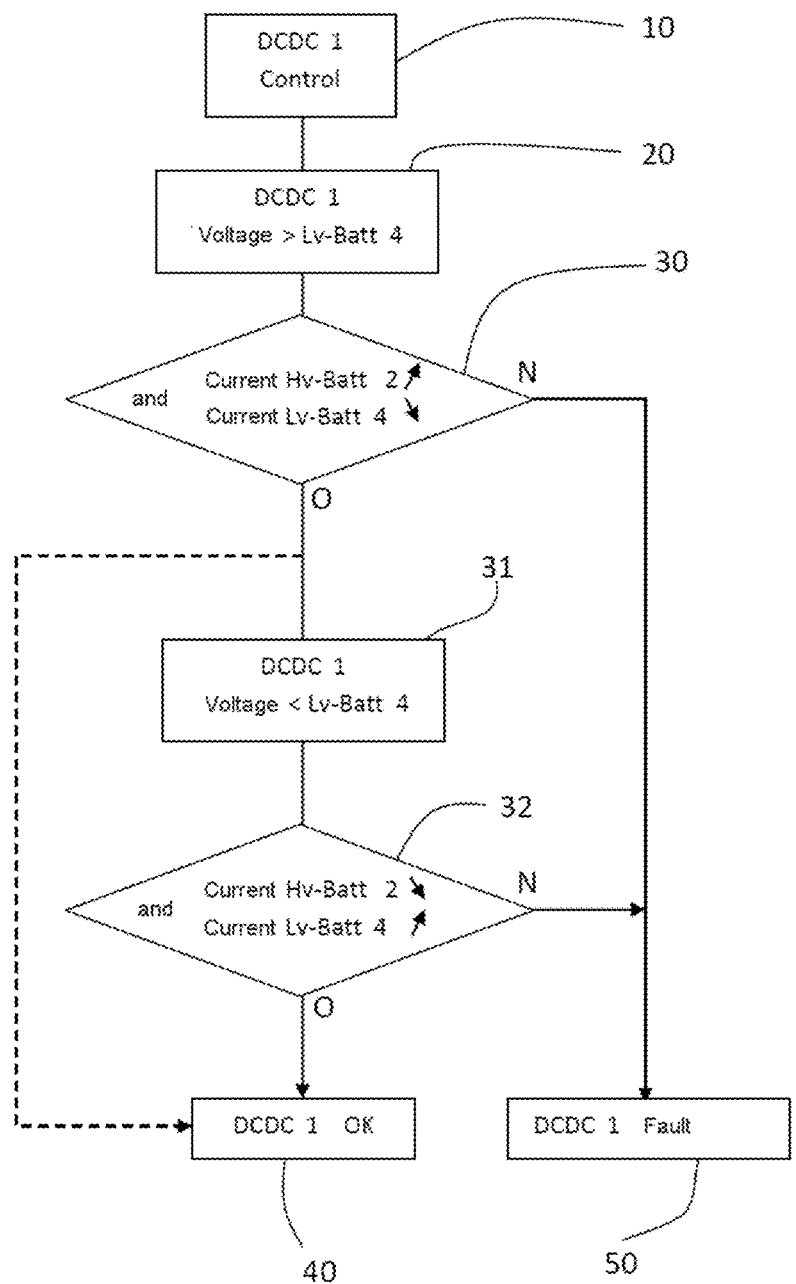
FIG. 4 shows a logical diagram of a second specific example for implementing the first and second general examples according to FIG. 1.

The buck static DC-DC voltage converter 1 is commanded by control and safety means 6 actuated by a motor control unit (not shown), preferably during the vehicle stop stages with a view to using a method according to the invention, particularly such as the means are described using FIGS. 2-4.

In FIGS. 2-4, the logical diagrams refer to the converter 1 using the abbreviation DCDC 1, the first voltage source 2 using the abbreviation Hv-Batt 2, the second voltage source 4 using the abbreviation Lv-Batt 4, the primary circuit 3 using the abbreviation PC 3, and the secondary circuit 5 using the abbreviation SC 5.

FIG. 2 illustrates, on the same logical diagram, the first and second general examples for implementing a method according to the invention in order to establish a functional diagnosis for the buck static DC-DC voltage converter 1, on a circuit as shown, for example, in FIG. 1.

The method according to FIG. 2 and according to the first general example comprises the following steps:

Step 10: deactivating any power consumer on the primary circuit 3, or waiting for any power consumer on the primary circuit 3 to be inactive, in order to ensure that no power is drawn from the first voltage source 2 while the diagnostic method is carried out, Step 20: then commanding from the converter 1 an output voltage greater than the voltage of the second electrical voltage source 4, via the control and safety means 6 of the converter 1, Step 30: then determining if there is a power transfer from the primary circuit 3 to the secondary circuit 5, and Step 40: if so, in accordance with the dotted line in FIG. 2, establishing a correct functionality diagnosis for the converter 1, Step 50: if not, establishing a faulty functionality diagnosis for the converter 1.

Alternatively, the method shown in FIG. 2 according to the second general example does not establish a correct functionality diagnosis for the converter 1 directly at the end of step 30. The dotted line is excluded from this second example. Therefore, according to this second general example, the method further comprises the following steps, from step 30, in the case of a noted power transfer from the primary circuit 3 to the secondary circuit 5, and in the case of a current-non-reversible buck static DC-DC voltage converter 1:

Step 31: then commanding from the voltage converter 1 an output voltage that is less than the voltage of the second electrical voltage source 4, Step 32: then determining if the second electrical voltage source 4 discharges into the secondary circuit 5, and:

Step 40: if so, establishing a correct functionality diagnosis for the voltage converter 1, Step 50: if not, establishing a faulty functionality diagnosis for the voltage converter 1.

The logical diagram of FIG. 3 takes up the logical diagram of FIG. 2 and details the content of the steps 30 and 32, according to a first specific example of implementing the two general examples of methods as are defined by the logical diagram of FIG. 2. According to the example of FIG. 3, the power supply circuit as described, for example, in FIG. 1 further comprises an electric voltmeter (not shown).

Preferably, according to FIG. 3, the step 30 of determining if there is a power transfer from the primary circuit 3 to the secondary circuit 5, involves determining if the discharge current of the first voltage source 2 increases and if the voltage of the second voltage source 4 increases.

Preferably, according to FIG. 3, the step 32 of determining if the second electrical voltage source 4 discharges into the secondary circuit 5, involves determining if the discharge current of the first voltage source 2 decreases and if the voltage of the second voltage source 4 decreases.

The logical diagram of FIG. 4 takes up the logical diagram of FIG. 2 and details the content of the steps 30 and 32, according to a second specific example of implementing the two general method examples as are defined by the logical diagram of FIG. 2.

Preferably, according to FIG. 4, the step 30 of determining if there is a power transfer from the primary circuit 3 to the secondary circuit 5, involves determining if the discharge current of the first voltage source 2 increases and if the discharge current of the second voltage source 4 decreases.

Preferably, according to FIG. 4, the step 32 of determining if the second electrical voltage source 4 discharges into the secondary circuit 5, involves determining if the discharge current of the first voltage source 2 decreases and if the discharge current of the second voltage source 4 increases.

Figure 5:
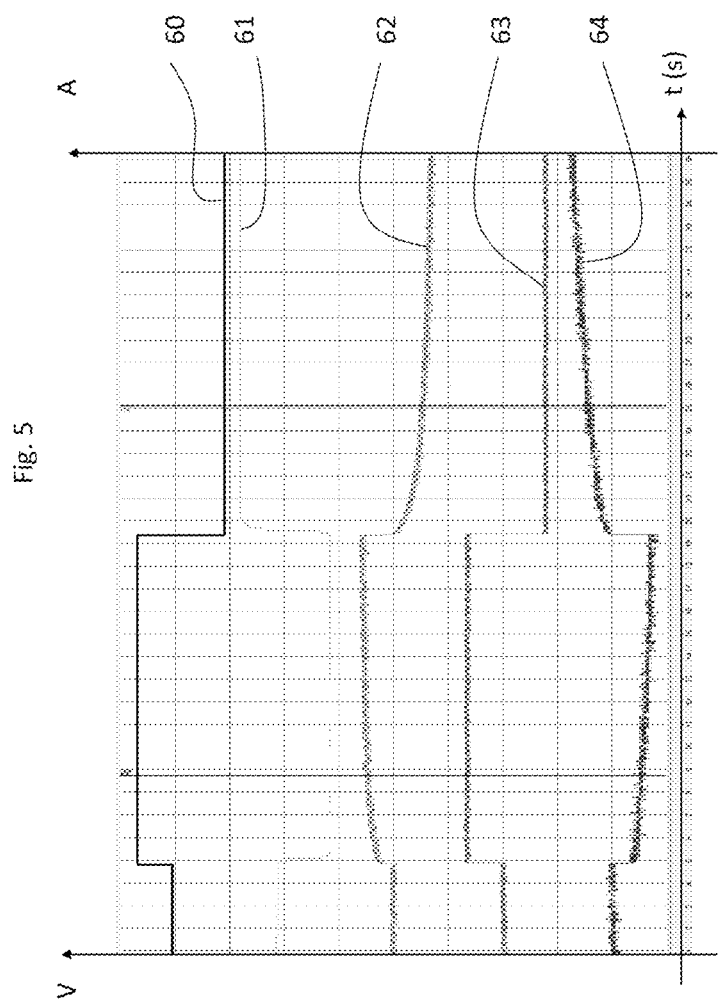
FIG. 5 shows a diagram illustrating the progression of the voltage and of the discharge current of the first and second voltage sources, in the course of the method examples described in FIGS. 2-4.

FIG. 5 shows a progression diagram for the quantities monitored, i.e. voltages and currents of the first and second voltage sources 2 and 4, within the context of the methods described above using FIGS. 2-4. FIG. 5 shows the time in seconds on the x-axis, the current in amps on the right-hand y-axis, and the voltage in volts on the left-hand y-axis.

In FIG. 5, the curve 60 shows the voltage command of the voltage converter 1. The curve 61 shows the current response of the second voltage source 4. The curve 62 shows the voltage response of the second voltage source 4. The curve 63 shows the current response of the first voltage source 2. The curve 64 shows the voltage response of the first voltage source 2.

In FIG. 5, the numerical scales for the voltages (on the left) and for the currents (on the right) on the y-axes are not indicated. The corresponding y-axes respectively allow the sense of variation of the considered quantity to be illustrated.

In FIG. 5, in chronological order, in the case of the first general example, in accordance with the command curve 60 for the converter 1, an output voltage is commanded, substantially at the moment t=5 s in the example, from the voltage converter 1, which output voltage is greater than the voltage of the second voltage source shown by the curve 62, this being almost instantly with respect to the time scale, as the curve 60 illustrates with the shown square wave signal. For example, the voltage increase can represent slightly more than one volt, preferably between one and two volts as is shown, such that the converter 1 delivers a voltage of approximately 15 volts for a second voltage source taking the form of a lead-acid battery, the voltage of which is between 10.5 and 14 volts approximately.

An almost immediate increase in the discharge current of the first voltage source is then noted (step 30—FIG. 3) on the curve 63 and a voltage increase, which is also almost immediate, of the second voltage source is noted on the curve 62, still with respect to the time scale. These two combined indicators allow for direct diagnosis, in the case of a first specific example of the first general example, of a correct functionality of the voltage converter 1 at the step 40.

Alternatively, an almost immediate increase in the discharge current of the first voltage source is noted (step 30—FIG. 4) on the curve 63 and a decrease, which is also almost immediate, in the discharge current of the second voltage source is noted on the curve 61, with respect to the time scale. These two combined indicators allow for a direct alternative diagnosis, in the case of a second specific example of the first general example, of a correct functionality of the voltage converter 1 at the step 40.

In FIG. 5, still in chronological order, in the case of the second general example, and in the case of a current-non-reversible buck static DC-DC voltage converter 1, in accordance with the command curve 60 for the converter 1, an output voltage is advantageously commanded then, substantially at the moment t=19 s in the example, from the voltage converter 1, which output voltage is less than the voltage of the second voltage source shown by the curve 62, this being almost instantly with respect to the time scale, as the curve 60 illustrates with the shown square wave signal. For example, the voltage decrease can represent slightly less than 5 volts from the voltage increased at step 20, such that the converter 1 delivers a voltage less than 10.8 volts corresponding substantially to the no-load voltage of the battery, for a second voltage source taking the form of a lead-acid battery, the voltage of which is between 10.5 and 14 volts approximately, for example a voltage of approximately 10.5 volts as is shown in FIG. 5.

Further noted then (step 32—FIG. 3), on the curve 63, is an almost immediate decrease in the discharge current of the first voltage source and, on the curve 62, a voltage decrease, that is also firstly almost immediate, of the second voltage source, with respect to the time scale, then a progressive decrease in this voltage thereafter. These two combined indicators allow, in the case of a first specific example of the second general example, a correct functionality diagnosis for the voltage converter 1 to be established at the step 40. Otherwise, a faulty functionality diagnosis for the converter 1 is established at the step 50.

Alternatively, further noted (step 32—FIG. 4), on the curve 63, is an almost immediate decrease in the discharge current of the first voltage source and, on the curve 61, an increase, which is also almost immediate, in the discharge current of the second voltage source, still with respect to the time scale. These two combined indicators alternatively allow, in the case of a second specific example of the second general example, a correct functionality diagnosis for the voltage converter 1 to be established at the step 40. Otherwise, a faulty functionality diagnosis for the converter 1 is established at the step 50.

The invention claimed is:

1. A method for establishing a functional diagnosis for a buck static DC-DC voltage converter (1) in an electric or hybrid vehicle comprising a power supply circuit, the latter including at least a first electrical voltage source (2) supplying a primary circuit (3) with direct current, and a second electrical voltage source (4) supplying a secondary circuit (5) with direct current, the first source (2) having a voltage value greater than the second source (4), said primary and secondary circuits (3) and (5) being connected to one another by means of said buck static DC-DC voltage converter (1) which itself is commanded by control and safety means (6), wherein the method comprises the following steps:
   Step (10): deactivating any power consumer on said primary circuit (3) or waiting for any power consumer on the primary circuit (3) to be inactive,
   Step (20): then commanding from said converter (1) an output voltage greater than the voltage of the second electrical voltage source (4),
   Step (30): then determining if there is a power transfer from said primary circuit (3) to said secondary circuit (5), and:
   Step (50): if not, establishing a faulty functionality diagnosis for said converter (1).

2. The method as claimed in claim 1, wherein the step (30) of determining if there is a power transfer from said primary circuit (3) to said secondary circuit (5), involves determining if the discharge current of the first voltage source (2) increases and if the voltage of the second voltage source (4) increases.

3. The method as claimed in claim 2, further comprising a step (40) of establishing a correct functionality diagnosis for said converter (1), in the case of a noted power transfer from the primary circuit (3) to the secondary circuit (5).

4. The method as claimed in claim 2, further comprising the following steps, in the case of a noted power transfer from the primary circuit (3) to the secondary circuit (5), and in the case of a current-non-reversible buck static DC-DC voltage converter:
   Step (31): then commanding from said voltage converter (1) an output voltage that is less than the voltage of the second electrical voltage source (4),
   Step (32): then determining if the second electrical voltage source (4) discharges into the secondary circuit (5), and:
   Step (40): if so, establishing a correct functionality diagnosis for said converter (1),
   Step (50): if not, establishing a faulty functionality diagnosis for said converter (1).

5. The method as claimed in claim 4, wherein the step (32) of determining if the second electrical voltage source (4) discharges into the secondary circuit (5), involves determining if the discharge current of the first voltage source (2) decreases and if the voltage of the second voltage source (4) decreases.

6. The method as claimed in claim 4, wherein the step (32) of determining if the second electrical voltage source (4) discharges into the secondary circuit (5), involves determining if the discharge current of the first voltage source (2) decreases and if the discharge current of the second voltage source (4) increases.

7. The method as claimed in claim 1, wherein the step (30) of determining if there is a power transfer from said primary circuit (3) to said secondary circuit (5), involves determining if the discharge current of the first voltage source (2) increases and if the discharge current of the second voltage source (4) decreases.

8. The method as claimed in claim 7, further comprising a step (40) of establishing a correct functionality diagnosis for said converter (1), in the case of a noted power transfer from the primary circuit (3) to the secondary circuit (5).

9. The method as claimed in claim 7, further comprising the following steps, in the case of a noted power transfer from the primary circuit (3) to the secondary circuit (5), and in the case of a current-non-reversible buck static DC-DC voltage converter:

Step (31): then commanding from said voltage converter (1) an output voltage that is less than the voltage of the second electrical voltage source (4), Step (32): then determining if the second electrical voltage source (4) discharges into the secondary circuit (5), and:

Step (40): if so, establishing a correct functionality diagnosis for said converter (1), Step (50): if not, establishing a faulty functionality diagnosis for said converter (1).

10. The method as claimed in claim 9, wherein the step (32) of determining if the second electrical voltage source (4) discharges into the secondary circuit (5), involves determining if the discharge current of the first voltage source (2) decreases and if the voltage of the second voltage source (4) decreases.

11. The method as claimed in claim 9, wherein the step (32) of determining if the second electrical voltage source (4) discharges into the secondary circuit (5), involves determining if the discharge current of the first voltage source (2) decreases and if the discharge current of the second voltage source (4) increases.

12. The method as claimed in claim 1, further comprising a step (40) of establishing a correct functionality diagnosis for said converter (1), in the case of a noted power transfer from the primary circuit (3) to the secondary circuit (5).

13. The method as claimed in claim 1, further comprising the following steps, in the case of a noted power transfer from the primary circuit (3) to the secondary circuit (5), and in the case of a current-non-reversible buck static DC-DC voltage converter:

Step (31): then commanding from said voltage converter (1) an output voltage that is less than the voltage of the second electrical voltage source (4), Step (32): then determining if the second electrical voltage source (4) discharges into the secondary circuit (5), and:

Step (40): if so, establishing a correct functionality diagnosis for said converter (1), Step (50): if not, establishing a faulty functionality diagnosis for said converter (1).

14. The method as claimed in claim 13, wherein the step (32) of determining if the second electrical voltage source (4) discharges into the secondary circuit (5), involves determining if the discharge current of the first voltage source (2) decreases and if the voltage of the second voltage source (4) decreases.

15. The method as claimed in claim 13, wherein the step (32) of determining if the second electrical voltage source (4) discharges into the secondary circuit (5), involves determining if the discharge current of the first voltage source (2) decreases and if the discharge current of the second voltage source (4) increases.

* * * * *